(12) United States Patent
Creed et al.

(10) Patent No.: US 10,586,878 B2
(45) Date of Patent: Mar. 10, 2020

(54) APPARATUS AND METHOD FOR A LOW LOSS COUPLING CAPACITOR

(71) Applicant: Futurewei Technologies, Inc., Plano, TX (US)

(72) Inventors: Brian Creed, Batavia, IL (US); Lawrence Connell, Naperville, IL (US); Kent Jaeger, Cary, IL (US); Matthew Richard Miller, Arlington Heights, IL (US)

(73) Assignee: Futurewei Technologies, Inc., Plano, TX (US)

(*) Notice: Subject to any disclaimer, the term of this patent is extended or adjusted under 35 U.S.C. 154(b) by 10 days.

(21) Appl. No.: 15/830,927

(22) Filed: Dec. 4, 2017

(65) Prior Publication Data
US 2018/0090627 A1 Mar. 29, 2018

Related U.S. Application Data

(62) Division of application No. 14/687,549, filed on Apr. 15, 2015, now Pat. No. 9,837,555.

(51) Int. Cl.
| | | |
|---|---|---|
| *H01L 29/93* | (2006.01) | |
| *H01L 29/94* | (2006.01) | |
| *H01L 29/66* | (2006.01) | |
| *H01L 29/10* | (2006.01) | |
| *H01L 27/08* | (2006.01) | |

(52) U.S. Cl.
CPC .......... *H01L 29/93* (2013.01); *H01L 27/0805* (2013.01); *H01L 29/1095* (2013.01); *H01L 29/66189* (2013.01); *H01L 29/94* (2013.01)

(58) Field of Classification Search
CPC ............................ H01L 27/0808; H01L 29/93
See application file for complete search history.

(56) References Cited

U.S. PATENT DOCUMENTS

| | | | |
|---|---|---|---|
| 6,100,770 | A | 8/2000 | Litwin et al. |
| 6,407,412 | B1 | 6/2002 | Iniewski et al. |
| 8,498,094 | B2 | 7/2013 | Marino et al. |
| 2002/0063333 | A1 | 5/2002 | Farrar |

(Continued)

FOREIGN PATENT DOCUMENTS

| | | |
|---|---|---|
| CN | 1270704 A | 10/2000 |
| CN | 1434519 A | 8/2003 |

(Continued)

*Primary Examiner* — Moazzam Hossain
(74) *Attorney, Agent, or Firm* — Slater Matsil, LLP

(57) ABSTRACT

Embodiments are provided herein for low loss coupling capacitor structures. The embodiments include a n-type varactor (NVAR) configuration and p-type varactor (PVAR) configuration. The structure in the NVAR configuration comprises a p-doped semiconductor substrate (Psub), a deep n-doped semiconductor well (DNW) in the Psub, and a p-doped semiconductor well (P well) in the DNW. The circuit structure further comprises a source terminal of a p-doped semiconductor material within P well, and a drain terminal of the p-doped semiconductor material within the P well. Additionally, the circuit structure comprises an insulated gate on the surface of the P well, a metal pattern comprising a plurality of layers of metal lines, and a plurality of vias through the metal lines. The vias are contacts connecting the metal lines to the gate, the source terminal, and the drain terminal.

17 Claims, 8 Drawing Sheets

(56) References Cited

U.S. PATENT DOCUMENTS

| | | |
|---|---|---|
| 2002/0074589 A1* | 6/2002 | Benaissa .............. H01L 27/0808 257/312 |
| 2002/0140109 A1 | 10/2002 | Keshawarzi et al. |
| 2003/0136992 A1 | 7/2003 | Adan |
| 2004/0184216 A1* | 9/2004 | Kurosawa ........... H01L 27/0808 361/277 |
| 2005/0269619 A1 | 12/2005 | Shor et al. |
| 2006/0006431 A1 | 1/2006 | Jean et al. |
| 2006/0024905 A1 | 2/2006 | He et al. |
| 2008/0048236 A1 | 2/2008 | Kim |
| 2009/0253240 A1 | 10/2009 | Tam et al. |
| 2010/0226166 A1 | 9/2010 | Jung et al. |
| 2011/0031588 A1* | 2/2011 | Welch .................... H01L 29/93 257/595 |
| 2011/0204969 A1* | 8/2011 | Chen ................... H01L 29/7391 327/581 |
| 2011/0298559 A1 | 12/2011 | Kitching et al. |
| 2012/0187494 A1* | 7/2012 | Huang .................... H01L 29/93 257/368 |
| 2013/0293297 A1 | 11/2013 | Mucha et al. |
| 2013/0320421 A1 | 12/2013 | Chiu et al. |
| 2015/0028407 A1* | 1/2015 | Luo ........................ H01L 29/94 257/300 |
| 2015/0194538 A1 | 7/2015 | Marino et al. |
| 2015/0236014 A1* | 8/2015 | Gathman ............ H01L 27/0808 327/537 |
| 2015/0364426 A1 | 12/2015 | Singh et al. |

FOREIGN PATENT DOCUMENTS

| | | |
|---|---|---|
| CN | 1707813 A | 12/2005 |
| CN | 101110421 A | 1/2008 |
| CN | 101197371 A | 6/2008 |

* cited by examiner

APPARATUS AND METHOD FOR A LOW LOSS COUPLING CAPACITOR

CROSS-REFERENCE TO RELATED APPLICATIONS

This application is a Divisional Application of U.S. patent application Ser. No. 14/687,549, filed on Apr. 15, 2015, which application is hereby incorporated herein by reference.

TECHNICAL FIELD

The present invention relates to metal-oxide-semiconductor (MOS) capacitor design, and, in particular embodiments, to an apparatus and method for a low loss coupling capacitor that can be used for radio frequency (RF) or other applications.

BACKGROUND

A coupling capacitor is a type of capacitor that can be used to isolate one circuit block direct current (DC) bias from another circuit block DC bias. For example, in analog circuits, a coupling capacitor is used to connect two circuits such that only the AC signal from the first circuit can pass through to the next, while the DC is blocked. This technique helps to isolate the DC bias settings of the two coupled circuits. In another example, a coupling capacitor can be used for AC coupling in digital circuits to transmit digital signals with a zero DC component, also referred to as DC-balanced signals. DC-balanced waveforms are useful in communications systems, since they can be used over AC-coupled electrical connections to avoid voltage imbalance problems and charge accumulation between connected systems or components. There is a need to improve the coupling capacitor design to reduce losses and improve coupling efficiency, while also minimizing the design size of the capacitor structure. For example, this can be useful in compact devices to reduce size and power consumption.

SUMMARY OF THE INVENTION

In accordance with an embodiment, a circuit structure for a coupling capacitor comprises a p-doped semiconductor substrate (Psub), and a deep n-doped semiconductor well (DNW) in the Psub, a p-doped semiconductor well (P well) in the DNW. The circuit structure further comprises a first block of a p-doped semiconductor material extending from a surface of the P well into the P well, and a second block of the p-doped semiconductor material extending from the surface of the P well into the P well. The first block is a source terminal, and the second block is a drain terminal. Additionally, the circuit structure comprises an insulating layer over the P well between the source and drain, a conductor material on the surface of the insulating layer serving as the gate, a metal pattern comprising a plurality of layers of metal lines approximately parallel to the surface, and a plurality of vias through the metal lines and vertical to the metal lines. The lowest level vias are contacts connecting the metal lines to the gate, the source terminal, and the drain terminal.

In accordance with another embodiment, a circuit structure for a coupling capacitor comprises a Psub, and a n-doped semiconductor well (N well) in the Psub. The circuit structure further comprises a first block of a n-doped semiconductor material extending from a surface of the N well into the N well, and a second block of the n-doped semiconductor material extending from the surface of the N well into the N well. The first block serves is a source terminal, and the second block is a drain terminal. Additionally, the circuit structure further comprises an insulating layer on the surface of the N well between the source and drain, a conductor material on the surface of the insulating layer serving as the gate, a metal pattern comprising a plurality of layers of metal lines approximately parallel to the surface, and a plurality of vias through the metal lines and vertical to the metal lines. Contacts connect the metal lines to the gate, the source terminal, and the drain terminal.

In accordance with another embodiment, a method for making a coupling capacitor structure in a n-type varactor (NVAR) configuration includes forming a DNW in a Psub, forming a p-doped semiconductor well (P well) in the DNW, placing an insulator on the surface of the P well followed by a metal gate on a surface of the insulator. The method further includes forming, inside the P well within the surface of the P well, a p-doped semiconductor source terminal on one side of the insulator and metal gate, and a p-doped semiconductor drain terminal on an opposite side of the insulator and metal gate. A plurality of layers of metal lines is overlaid over the metal gate and the source/drain terminals. Further, a plurality of vias are inserted vertical to the layers and connecting the metal lines with the metal gate, the p-doped semiconductor source terminal, and the p-doped semiconductor drain terminal.

In accordance with yet another embodiment, a method for making a coupling capacitor structure in a p-type varactor (PVAR) configuration includes forming a N well in a Psub, placing an insulator followed by a metal gate on a surface of the N well, and forming, inside the N well within the surface of the P well, a n-doped semiconductor source terminal on one side of the insulator/metal gate, and a n-doped semiconductor drain terminal on an opposite side of the insulator/metal gate. The method further includes overlaying a plurality of layers of metal lines is overlaid over the metal gate and the source/drain terminals. Further, a plurality of vias are inserted vertical to the layers connecting the metal lines to the metal gate, the n-doped semiconductor source terminal, and the n-doped semiconductor drain terminal.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments are provided herein for low loss coupling capacitor structures, which can be constructed using metal-oxide-semiconductor (MOS) technology or other suitable integrated circuit manufacturing processes. The embodiments include a n-type varactor (NVAR) configuration and p-type varactor (PVAR) configuration. The choice of the configuration depends on the circuit conditions and the application of interest. A varactor is a type of diode of which capacitance varies as a function of the voltage applied across its terminals. Varactors can be used as voltage-controlled capacitors, such as in voltage-controlled oscillators, parametric amplifiers, and frequency multipliers, which can be used in radio transmitters or signal modulators, for example. In the NVAR and PVAR configurations, multiple gate and source/drain connections are realized using stacked layers of interleaved metal patterns for the gate and source/drain connections, respectively. The structures designs can reduce resistance and parasitic capacitance, which lower losses in the capacitors. The parasitic capacitance can be reduced by reverse biasing the structure well capacitance. Further, the metal pattern is designed to enhance wanted capacitance and reduce parasitic capacitance. The structures also allow the integration of multiple coupling capacitors, e.g., in an array, on a chip with compact dimensions, thus achieving high capacitance per area. Such structures can be used for radio frequency (RF) or wireless signal applications, for instance, to provide low loss RF differential signal paths. The differential signals can be accommodated by placing the capacitors in isolated wells.

Figure 1:
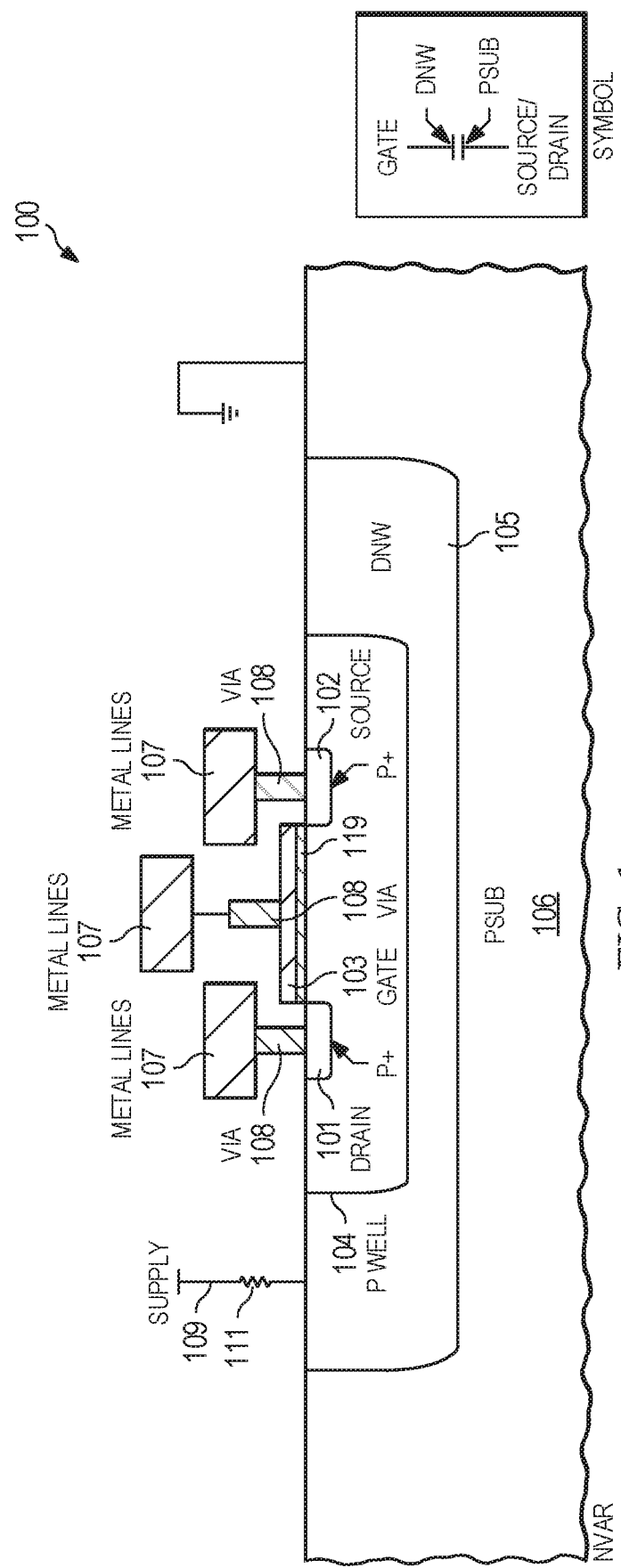
FIG. 1 is a cross-sectional side view of an embodiment of a capacitor structure in a n-type varactor (NVAR) configuration.

FIG. 1 shows an embodiment of a capacitor structure (circuit) in a NVAR configuration 100. The NVAR configuration 100 comprises a suitable p-type semiconductor (P) block that acts as a drain 101 (P+ drain) and another P block that acts as a source 102 (P+ source) for the capacitor. For instance, the drain 101 and source 102 are p-doped silicon or other suitable semiconductor material. Both the drain 101 and the source 102 are placed in a p-type well 104 (P well), for instance in p-doped Si. The P well 104 is formed within the semiconductor substrate 106, e.g., a Si substrate. Specifically, the substrate 106 (Psub) is p-doped. For example, the substrate 106 is p-dope Si. The P well 104 extends from the top of the surface to a suitable determined depth in the DNW 105. An insulating layer 119 is formed on the surface of P well 104, and a conductor block is formed on the top surface of the insulating layer 119 which is positioned approximately at the middle of the P well 104 beneath it. The conductor block acts as a gate 103 for the capacitor structure, and can be made of poly-Si or other suitable metal/conductor material. In other embodiments, semiconductor materials other than Si or poly-Si can be used to form the components above. Examples of such materials include silicon carbide (SiC), gallium arsenide (GaAs), and gallium nitride (GaN). Further, the P well 104 is placed in a deep n-type well 105 (DNW) within the substrate. The DNW 105 is formed within the Psub 106. The DNW 105 extends from the top of the surface to a suitable determined depth in the substrate 106. The DNW 105 is relatively heavily doped and is deeper and larger than the P well 104 and surrounds the P well 104, as shown. The DNW 105 is more heavily doped than the P well 104.

As shown, the source 102 and drain 101 are positioned in the P well 104, within the substrate 106, at opposite ends of the gate 103, which is placed over the surface of the substrate 106 with an insulating layer between the gate and P well. The gate forms one terminal of the capacitor. The source 102 and drain 101, form the second terminal, the source 102 and drain 101 are electrically connected through the P well and externally through metal connections as described below. This arrangement of the gate and source 102/drain 101 and insulator forms the coupling capacitor, where the capacitance is generated between the gate 103 and the source 102/drain 101 connection.

The cross-section side view of the structure in FIG. 1 shows one pair of source 102/drain 101 and corresponding gate 103 in the P well 104. However, the NVAR configuration 100 can comprise multiple capacitor elements configured as such, by distributing and overlaying source/drain and corresponding gate blocks across corresponding wells similar to the Psub 106. The capacitor elements can be interconnected, e.g., in parallel, to increase the coupling capacitance by stacking and interleaving metal lines (or wires) in layers on the surface and interconnecting the resulting metal pattern 107 using metal/conductor vias 108 to the corresponding gate and source/drain terminals at the surface level. The metal pattern 107 is overlaid over the surface, and the vias 108 are vertical vias that connect the corresponding metal lines to the corresponding gate and source/drain terminals. The metal pattern 107 comprises lines or wires that connect the gates, and further lines that connect the source/drain terminals. In an embodiment, the metal lines connecting the source/drain sides can be positioned next to and under the metal lines connecting the gate sides, as illustrated in FIG. 1. Examples of metal pattern design that can be used for interconnecting the capacitor elements are described below.

In the NVAR configuration 100, the capacitor structure separates two circuit blocks that are applied different DC bias (different DC voltages). The DC bias of one circuit block is connected to the source 102/drain 101, and the DC bias for the other circuit block is connected to the gate 103. As such, the two DC voltages bias the capacitor structure resulting in higher capacitance than the case where the source 102/drain 101 and gate 103 were not biased. For an NVAR, the gate is at a lower potential than the source 102/drain 101. The voltage supply 109 connected to the resistor 111 is set to a different voltage than that applied to the source 102/drain 101 or gate 103. The purpose of the different voltage of the supply 109 is to reverse bias both the P well 104/DNW 105 junction and the DNW 105/Psub 106 junction. Reverse biasing these junctions as such reduces unwanted parasitic capacitance.

Figure 2:
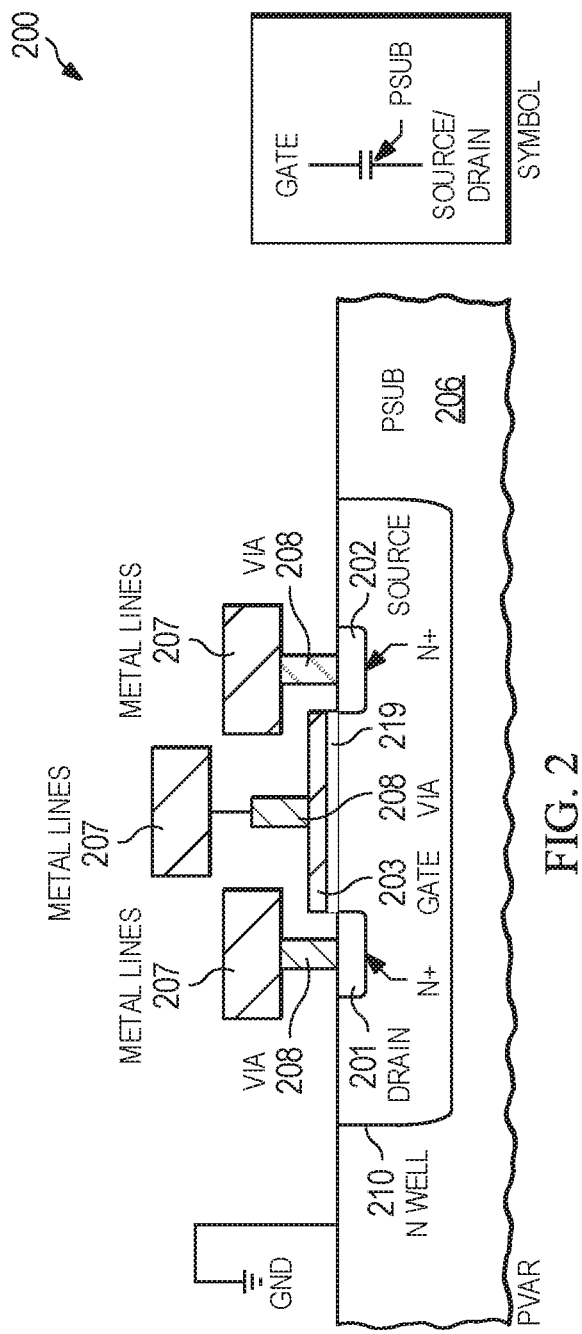
FIG. 2 is a cross-sectional side view of an embodiment of a capacitor structure in a p-type varactor (PVAR) configuration.

FIG. 2 shows an embodiment of a capacitor structure (circuit) in a PVAR configuration 200. The PVAR configuration 200 comprises a suitable n-type semiconductor (N) block that acts as a drain 201 (N+ drain) and another N block that acts as a source 202 (N+ source) for the capacitor. The drain 201 and source 202 are n-doped silicon or other suitable semiconductor material. Both the drain 201 and the source 202 can be placed in a n-type well 210 (N well), for instance in n-doped Si. The N well 210 is less heavily doped than the DNW 105 in the NVAR configuration 100. In the PVAR configuration 200, the N well 210 is formed within semiconductor substrate 206, e.g., a Si substrate. Specifically, the substrate 206 (Psub) is p-doped. For example, the substrate 206 is p-dope Si. The N well 210 extends from the top of the surface to a suitable determined depth in Psub 206. An insulating layer 219 is formed on the surface of the N well 210 followed by a conductor block positioned approximately at the middle of the N well 210 beneath it. The conductor block acts as a gate 203 for the capacitor structure, and can be made of poly-Si or other suitable metal/conductor material. In other embodiments, doped semiconductor materials other than Si or poly-Si, e.g., SiC, GaAs or Gan, can be used to form the components above.

As shown, the source 202 and drain 201 are positioned within the N well 210 at opposite ends of the insulator 219/gate 203, which is placed over the surface of P sub 206. The gate 203 forms one terminal of the PVAR capacitor and the source 202/drain 201 forms the second terminal of the PVAR capacitor. The source 202 and drain 201 are connected electrically by the N well 210 and externally by metal lines as described below.

Similar to the NVAR configuration 100, the cross-section side view of the PVAR configuration 200 in FIG. 2 shows one pair of source 202/drain 201 and corresponding gate 203 in the N well 210. However, the PVAR configuration 200 can comprise multiple capacitor elements configured as such, by distributing and overlaying source/drain and corresponding gate blocks across wells similar to the N well 210. The capacitor elements can be interconnected, e.g., in parallel, to increase the coupling capacitance by stacking and interleaving metal lines (or wires) in layers on the surface and interconnecting the resulting metal pattern 207 using metal/conductor vias 208 to the corresponding gate and source/drain terminals at the surface level. The metal pattern 207 is overlaid over the surface, and the vias 208 are vertical vias that connect the corresponding metal lines to the corresponding gate and source/drain terminals. The metal pattern 207 is similar to the metal pattern 107 and comprises lines that connect the gates, and further lines that connect the source/drain terminals. Similar to an NVAR, the PVAR separates two blocks biased with different DC biases. The DC bias of one block is connected to the gate 203 and the other DC bias is connected to the source 202/drain 201. In contrast to the NVAR, the gate bias is higher than the source/drain bias.

Figure 3:
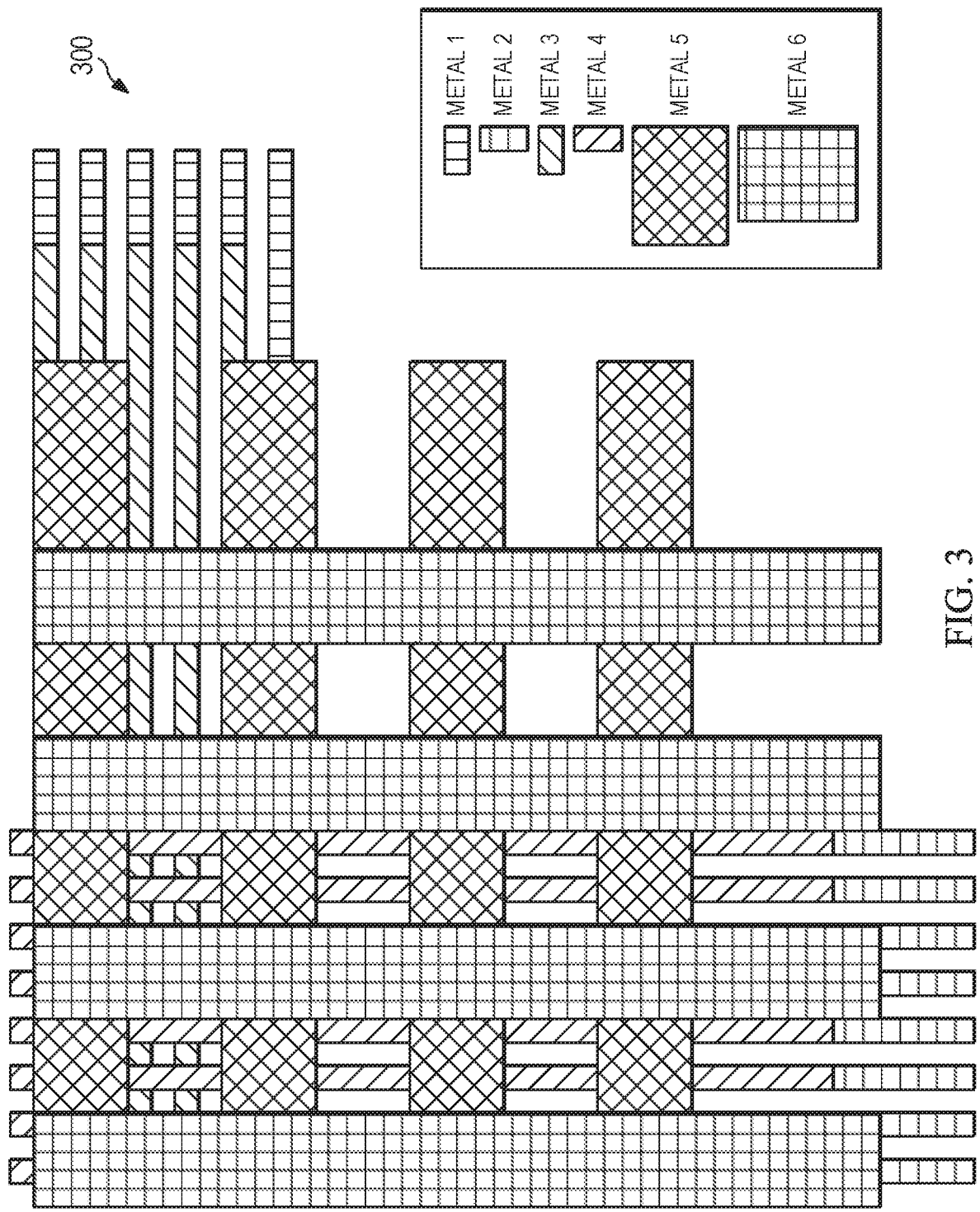
FIG. 3 shows a top view of an embodiment of a metal pattern for gate connection and source/drain connection.

FIG. 3 is a top view of an embodiment of a metal pattern 300 for gate connection and source/drain connection. For example, the metal pattern may correspond to the metal pattern 107 in the NVAR configuration 100 and similarly the metal pattern 207 in the PVAR configuration 200. The metal pattern 300 connects multiple source/drain terminals to other source/drain terminal blocks. The same or a similar metal arrangement connects multiple gate terminals to other gate terminal blocks on the capacitor structure (NVAR or PVAR structure), thus forming a combined capacitor with the desired increased capacitance and lower loss (e.g., due to lower parasitic capacitance and other parasitic parameters). The gate terminal forms one input of the capacitor, and the source/drain terminals form the second input of the capacitor. The source/drain terminals and gate blocks may be distributed, for example, in a two-dimensional array pattern in corresponding wells (P wells in NVAR or N wells in PVAR) in the structure substrate. The metal pattern 300 comprises stacked and interleaved conductor/metal lines or wires in the horizontal direction with respect to the structure substrate and vertical vias that connect the lines to their corresponding source/drain and gate blocks. The interleaved lines in any layer are adjacent lines that have alternating connections (using vias) to gate blocks and source/drain terminals. The pattern 300 is partially shown and shows a top view of multiple layers of lines (stacked vertically with respect to the substrate). In the actual structure, the metals lines extend to fill a given area on the substrate. In this example, the pattern 300 includes three layers for the gate connections and further three layers for the source/drain connections. The metal lines can be placed and aligned over the gate because capacitance between the gate and source/drain is desirable. However, the metal lines are not placed over the DNW or substrate because coupling to those areas results in undesirable parasitic capacitance. Reducing the parasitic capacitance as such reduces losses in the capacitor structure. The metal lines in each layer may be similar, and the metal lines in different layers may have different dimensions, such as different width, thickness, and or length.

Figure 4:
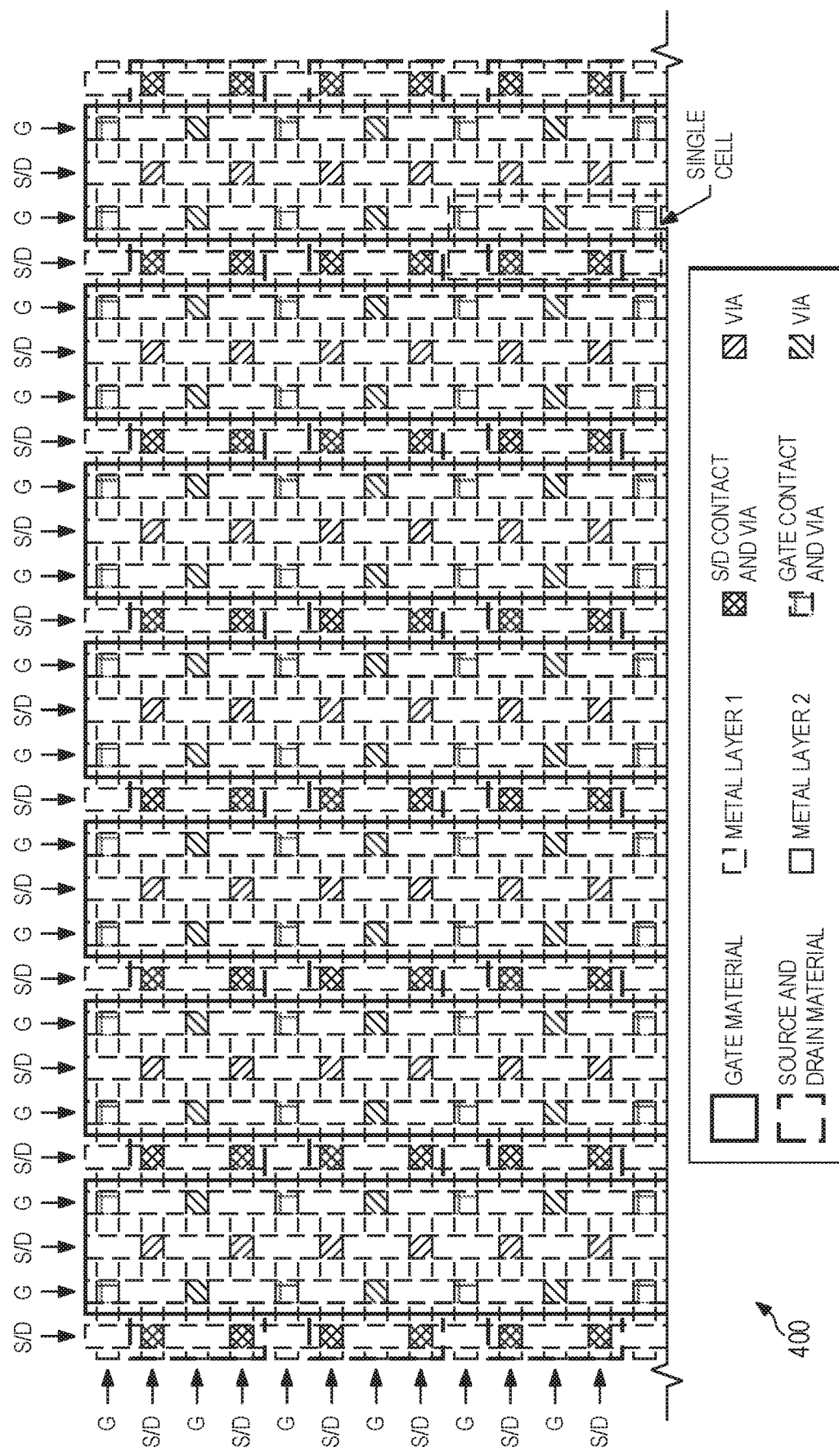
FIG. 4 is a top view of an embodiment of a capacitor array layout.

FIG. 4 is an isometric view of an embodiment of a metal pattern for gate and source/drain (S/D) connections, which may be used in the NVAR and similarly the PVAR configurations. The metal pattern comprises a plurality of layers, for instance, four layers (M1 to M4) in this example, of metal line connections to the gate elements and the source/drain elements. The lines in each layer are parallel and the lines of adjacent stacked layers are perpendicular. Each layer comprises alternating lines between gate connection lines and source/drain connection lines. The gate connection lines in the layers are connected to each other using vertical vias to the layers. Similarly, the source/drain connection lines in the layers are connected to each other using a separate set of vias.

Figure 5:
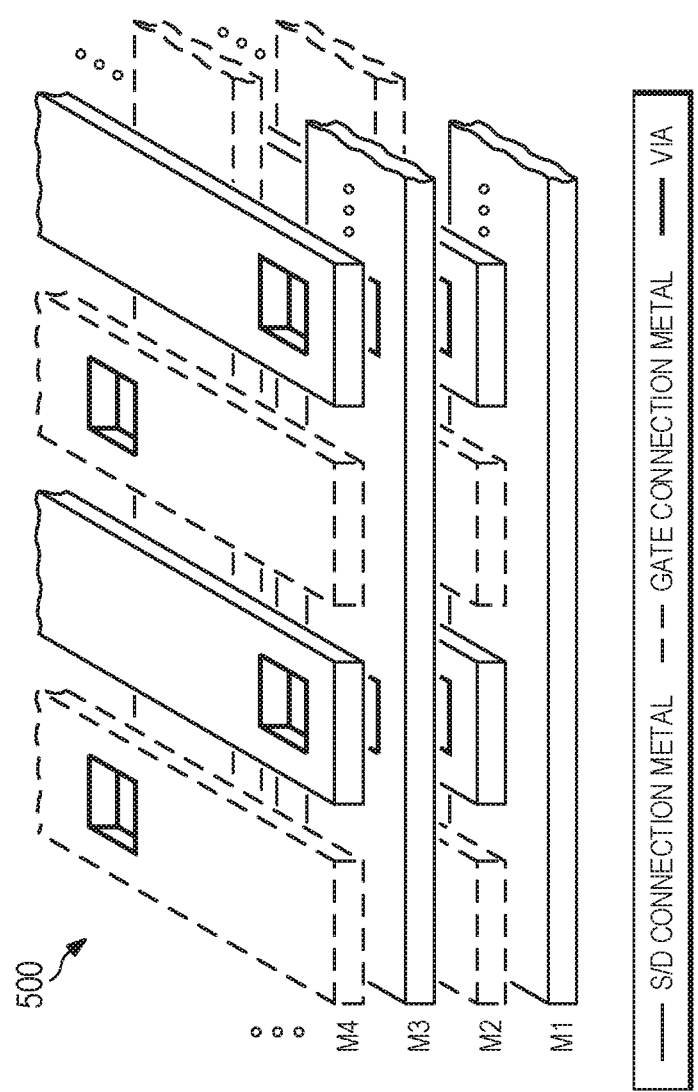
FIG. 5 is an isometric view of an embodiment of a metal pattern for gate and source/drain connection.

FIG. 5 is a top view of an embodiment of a capacitor array layout. The capacitor array can be arranged as such on the NVAR configuration 100 and similarly the PVAR configuration 200. The array comprises a plurality of similar cells, as shown. A first top metal layer (Metal Layer 1) comprises horizontal parallel metal lines with contacts (by vias) to the source, drain and gate material below the metal layers at the substrate surface. A second metal layer (Metal Layer 2) above the first metal layer comprises horizontal parallel metal lines also with vias to the first metal layer. In each metal layer above the first layer, vias connect to adjacent metal layers. In the first metal layer contacts connect to the gate and source/drain and vias connect to the layers above metal layer 1. Some of the metal lines or layers may not be directly connected to the gate and source/drain, but are connected by vias to other metal lines that are directly connected, by other vias, to the gate and source/drain. The layout can comprise additional layers of metal lines. The higher level metal layers (towards the top of the substrate) may have greater width and larger spacing than the lower metal layers. Stacking the metal connections in layers as such increases the effective capacitance of the overall structure and reduces loss due to the lower parasitic capacitance.

FIG. 5 is an isometric view of an embodiment of a metal pattern for gate and source/drain (S/D) connections, which may be used in the NVAR and similarly the PVAR configurations. The metal pattern comprises a plurality of layers, for instance, four layers (M1 to M4) in this example, of metal line connections to the gate elements and the source/drain elements. The lines in each layer are parallel and the lines of adjacent stacked layers are perpendicular. Each layer comprises alternating lines between gate connection lines and source/drain connection lines. The gate connection lines in the layers are connected to each other using vertical vias to the layers. Similarly, the source/drain connection lines in the layers are connected to each other using a separate set of vias.

Figure 6:
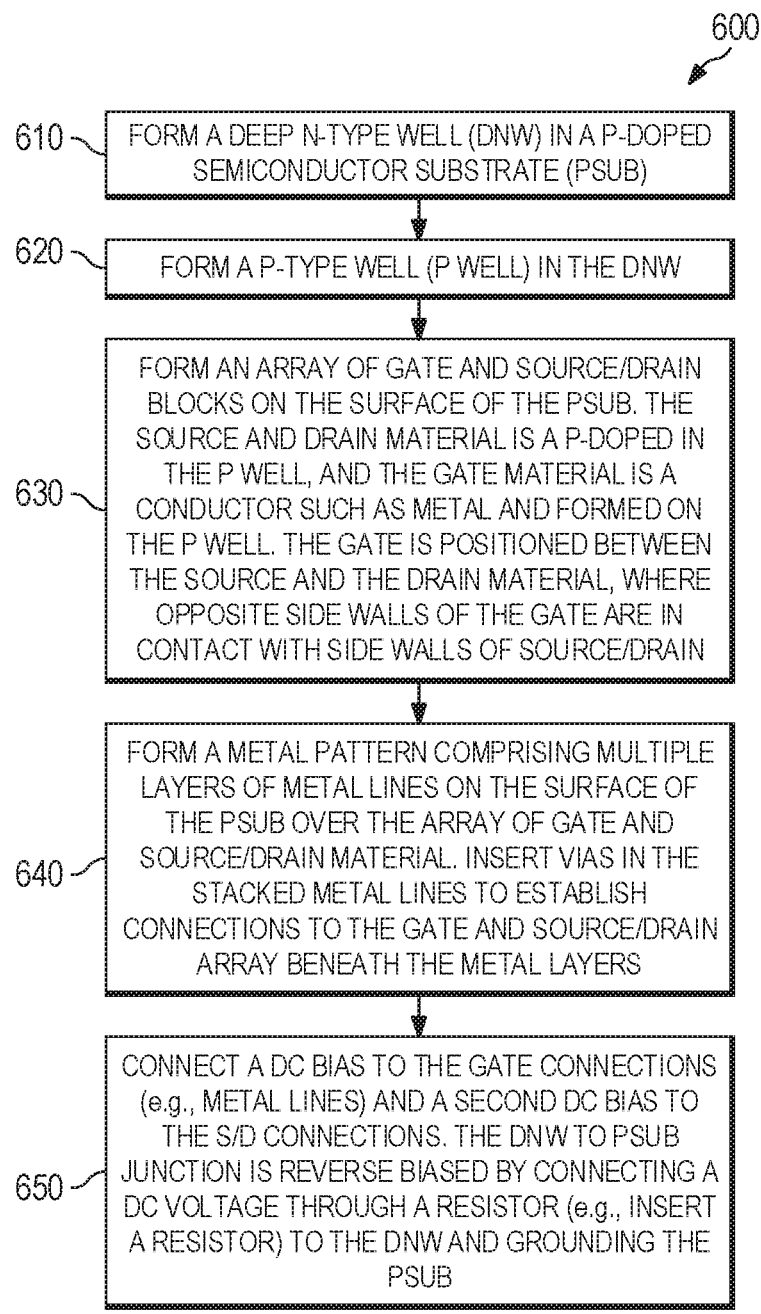
FIG. 6 shows an embodiment of a method for making a low loss coupling capacitor structure in a NVAR configuration.

FIG. 6 shows an embodiment of a method 600 for making a low loss coupling capacitor structure (circuit) with a NVAR configuration. The steps of the method 600 can be implemented using any suitable semiconductor processes and circuit fabrication technologies (e.g., lithographic and integrated chip fabrication processes). At step 610, A deep n-type well (DNW) such as n-dope Si is formed, e.g., via doping, in a p-doped semiconductor substrate (P sub), e.g., p-type Si. At step 620, an array of p-type wells (P wells) such as p-doped Si is formed in the DNW. At step 625, an array of insulating layer blocks are formed on the array of P wells. At step 630, an array of gate and source/drain blocks is formed on the array of P wells, at the surface of the p-doped substrate. The source and drain material is p-doped, e.g., p-type silicon, and the gate material is a conductor/metal. The source and drain blocks are placed, within the P wells, on opposite sides of the insulating layer blocks. The gate is positioned between the source and the drain blocks and on top of the insulating layer blocks. At step 640, a metal pattern comprising multiple layers of metal lines are formed on the substrate over the array of gate and source/drain material. At step 645, the stacked metal lines are connected with vertical vias (referred to as contacts) to the gate and source/drain array beneath the metal layers. At step 650, the coupling capacitor structure is biased by connecting a DC bias to the gate connections (e.g., metal lines) and the S/D connections. The DNW/P well junction and DNW/Psub junction are reversed biased by grounding the Psub and connecting a DC voltage supply through a resistor to the DNW portion of the structure (e.g., a resistor is inserted) in series between the supply and the DNW portion of the structure.

Figure 7:
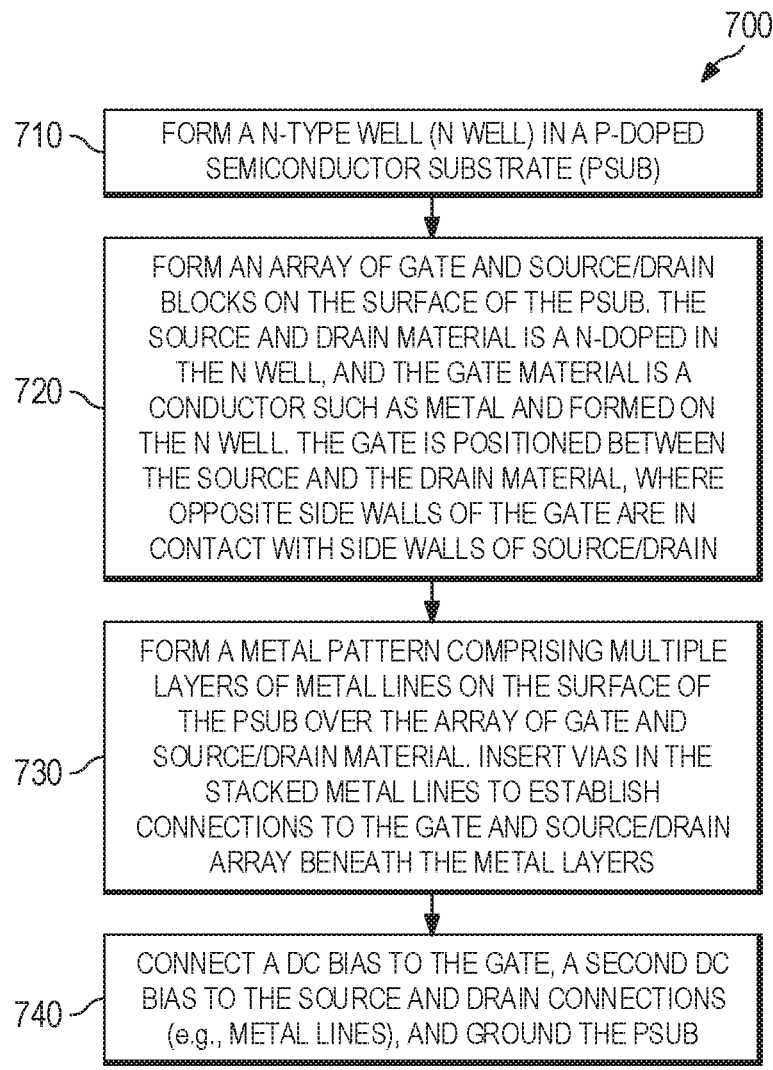
FIG. 7 shows an embodiment of a method for making a low loss coupling capacitor structure in a PVAR configuration.

FIG. 7 shows an embodiment of a method 700 for making a low loss coupling capacitor structure (circuit) with a PVAR configuration. The steps of the method 600 can be implemented using any suitable semiconductor processes and circuit fabrication technologies (e.g., lithographic and integrated chip fabrication processes). At step 710, an array of n-type wells (N wells) such as n-dope Si is formed, e.g., via doping, in a p-doped substrate (Psub), e.g., p-type Si. At step 715, an array of insulating layer blocks are formed on the array of N wells. At step 720, an array of gate and source/drain blocks is formed on the array of N wells, at the surface of the p-doped substrate. The source and drain material is n-doped, e.g., n-type silicon, and the gate material is a conductor/metal. The source and drain blocks are placed, within the N wells, on opposite sides of the insulating layer blocks. The gate is positioned between the source and the drain blocks and on top of the insulating layer blocks. At step 730, a metal pattern comprising multiple layers of metal lines are formed on the substrate over the array of gate and source/drain material. At step 735, the stacked metal lines are connected with vertical vias (contacts) to the gate and source/drain array beneath the metal layers. At step 740, the coupling capacitor structure is biased by connecting a DC bias to the gate, a second DC bias to the S/D connections (e.g., metal lines), and by grounding the Psub.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Figure 8:
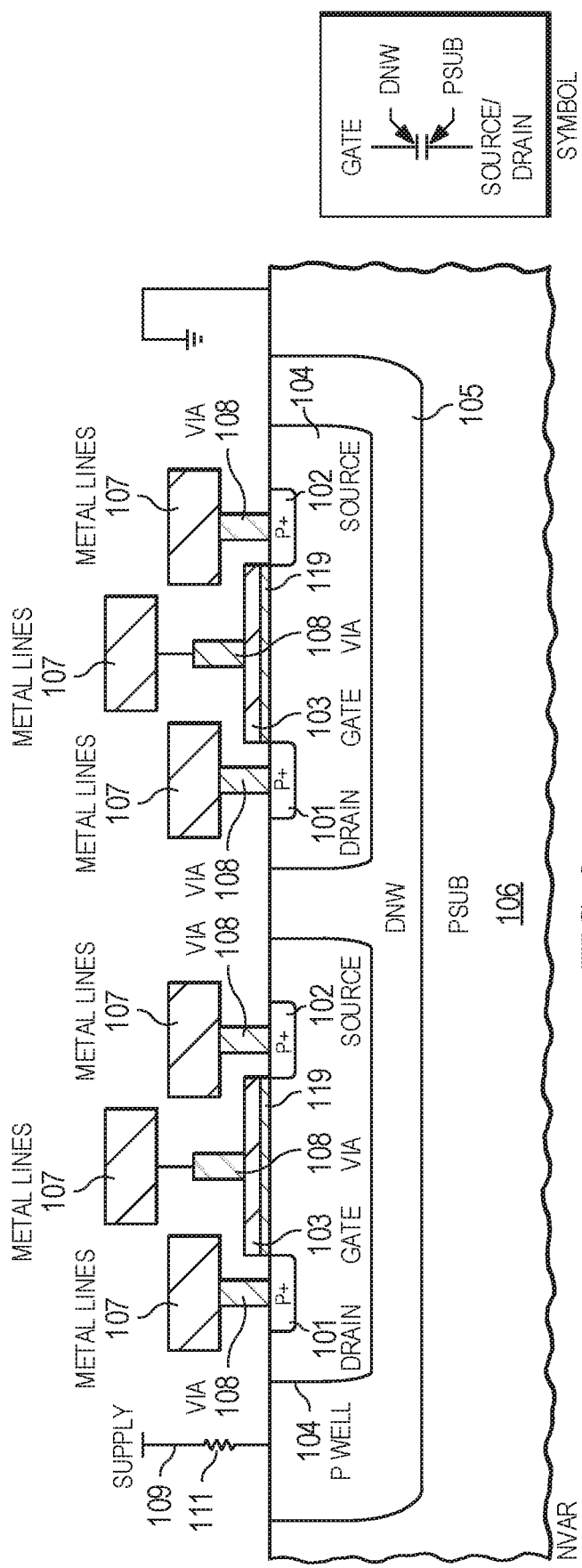
FIG. 8 is a cross-sectional side view of an embodiment of a capacitor structure in a NVAR configuration.

FIG. 8 shows an embodiment of a capacitor structure (circuit) in a NVAR configuration. The capacitor structure of FIG. 8 may be a specific implementation of the capacitor structure of FIG. 1 where an array of two or more P wells 104 are placed in a deep n-type well 105 (DNW) within a substrate 106 (Psub). All similarly numbered elements are as previously described.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A circuit structure for a coupling capacitor comprising:
   a p-doped semiconductor substrate (Psub);
   a first n-doped semiconductor well (N well) in the Psub;
   a first block of a n-doped semiconductor material extending from a surface of the first N well into the first N well, wherein the first block is a first source terminal;
   a second block of the n-doped semiconductor material extending from the surface of the first N well into the first N well, wherein the second block is a first drain terminal;
   a first insulator block on the first N well between the first source terminal and the first drain terminal;
   a first block of conductor material on the first insulator block between the first source terminal and the first drain terminal, wherein the first block of conductor material is a first gate;
   a first metal layer overlying the first gate, the first source terminal and the first drain terminal, the first metal layer comprising a plurality of first horizontal metal lines alternating between first gate connection lines and first source/drain connection lines;
   a first plurality of vertical vias connecting respective first horizontal metal lines to the first gate, the first source terminal and the first drain terminal;

a second metal layer overlying the first metal layer and comprising a plurality of second horizontal metal lines alternating between second gate connection lines and second source/drain connection lines, wherein the plurality of second horizontal metal lines are perpendicular to the plurality of first horizontal metal lines; and a second plurality of vertical vias connecting respective second gate connection lines to respective first gate connection lines, and respective second source/drain connection lines to respective first source/drain connection lines;

wherein an adjacency of each of the first gate connection lines and the first source/drain connection lines, the second gate connection lines and the second source/drain connection lines, the first source/drain connection lines and the second gate connection lines, and the first gate connection lines and the second source/drain connection lines, provides capacitance for the coupling capacitor.

2. The circuit structure of claim 1, further comprising:
a second N well in the Psub;
a third block of the n-doped semiconductor material that serves as a second source terminal, the second source terminal extending from the surface of the second N well into the second N well;
a fourth block of the n-doped semiconductor material that serves as a second drain terminal, the second drain terminal extending from the surface of the second N well into the second N well;
a second insulator block on the second N well between the second source terminal and the second drain terminal; and
a second block of conductor material on the second insulator block, wherein the second block of conductor material is a second gate, wherein the first plurality of vertical vias further connect the respective first horizontal metal lines to the second gate, the second source terminal, and the second drain terminal.

3. The circuit structure of claim 1, wherein the horizontal metal lines within each metal layer are approximately parallel.

4. The circuit structure of claim 1, wherein the horizontal metal lines in different metal layers have different dimensions including at least one of different spacing, different width, different depth, or different length.

5. The circuit structure of claim 1, wherein the horizontal metal lines in higher metal layers from the surface have greater width and larger spacing than the horizontal metal lines in lower metal layers.

6. The circuit structure of claim 1, wherein the first gate, the first source terminal, and the first drain terminal are configured to be coupled to direct current (DC) biases, and wherein the Psub is configured to be coupled to a ground potential.

7. The circuit structure of claim 1, wherein the Psub is more heavily doped than the first N well.

8. The circuit structure of claim 1, wherein opposite end sidewalls of the first gate are adjacent to sidewalls of the first source terminal and the first drain terminal.

9. A method for making a coupling capacitor structure, the method comprising:
forming a first n-doped semiconductor well (N well) in a p-doped semiconductor substrate (Psub);
forming a first block of a n-doped semiconductor material extending from a surface of the first N well into the first N well, the first block being a first source terminal;
forming a second block of the n-doped semiconductor material extending from the surface of the first N well into the first N well, the second block being a first drain terminal;
placing a first insulator block on the first N well between the first source terminal and the first drain terminal;
placing a first block of conductor material on the first insulator block between the first source terminal and the first drain terminal, the first block of conductor material being a first gate;
forming a first metal layer over the first gate, the first source terminal and the first drain terminal, the first metal layer comprising a plurality of first horizontal metal lines alternating between first gate connection lines coupled to the first gate, and first source/drain connection lines coupled to the first source terminal and the first drain terminal; and
forming a second metal layer over the first metal layer, the second metal layer comprising a plurality of second horizontal metal lines alternating between second gate connection lines coupled to the first gate connection lines, and second source/drain connection lines coupled to the first source/drain connection lines, the plurality of second horizontal metal lines being perpendicular to the plurality of first horizontal metal lines;
an adjacency of each of the first gate connection lines and the first source/drain connection lines, the second gate connection lines and the second source/drain connection lines, the first source/drain connection lines and the second gate connection lines, and the first gate connection lines and the second source/drain connection lines, providing capacitance for the coupling capacitor structure.

10. The method of claim 9, further comprising:
forming a second N well in the Psub;
forming a third block of the n-doped semiconductor material that serves as a second source terminal, the second source terminal extending from the surface of the second N well into the second N well;
forming a fourth block of the n-doped semiconductor material that serves as a second drain terminal, the second drain terminal extending from the surface of the second N well into the second N well;
placing a second insulator block on the second N well between the second source terminal and the second drain terminal;
placing a second block of conductor material on the second insulator block, the second block of conductor material being a second gate; and
connecting respective first horizontal metal lines to the second gate, the second source terminal, and the second drain terminal.

11. The method of claim 9, further comprising:
connecting the first gate, the first source terminal, and the first drain terminal to direct current (DC) biases; and
connecting the Psub to ground.

12. The method of claim 9, further comprising forming the horizontal metal lines within each metal layer approximately parallel to each other.

13. The method of claim 9, further comprising forming the horizontal metal lines, in different metal layers with different dimensions, including at least one of different spacing, different width, different depth, or different length.

14. The method of claim 9, further comprising forming the horizontal metal lines in higher metal layers from the surface with greater width and larger spacing than the horizontal metal lines in lower metal layers.

15. The method of claim 9, further comprising:
forming the first gate, the first source terminal, and the first drain terminal for coupling to direct current (DC) biases, and
forming the Psub for coupling to a ground potential.

16. The method of claim 9, further comprising more heavily doping the Psub than the first N well.

17. The method of claim 9, further comprising forming opposite end sidewalls of the first gate adjacent to sidewalls of the first source terminal and the first drain terminal.

\* \* \* \* \*